(12) United States Patent
Kraus et al.

(10) Patent No.: US 8,676,375 B2
(45) Date of Patent: Mar. 18, 2014

(54) AUTOMATED CASSETTE-TO-CASSETTE SUBSTRATE HANDLING SYSTEM

(75) Inventors: Joseph Arthur Kraus, Hamilton, NJ (US); Jeremy James Boyer, Chelmsford, MA (US); Joseph Mack, Manchester, NH (US); Michael DeChellis, Brooklyn, NY (US); Michael Koo, Somerset, NJ (US)

(73) Assignee: Veeco Instruments Inc., Plainview, NY (US)

( * ) Notice: Subject to any disclaimer, the term of this patent is extended or adjusted under 35 U.S.C. 154(b) by 82 days.

(21) Appl. No.: 13/406,076

(22) Filed: Feb. 27, 2012

(65) Prior Publication Data

US 2013/0226335 A1 Aug. 29, 2013

(51) Int. Cl.
*G06F 7/00* (2006.01)
*B65H 1/00* (2006.01)
*G05B 1/00* (2006.01)

(52) U.S. Cl.
USPC ........... 700/228; 700/213; 700/214; 700/222; 700/229

(58) Field of Classification Search
None
See application file for complete search history.

(56) References Cited

U.S. PATENT DOCUMENTS

| 2007/0065144 | A1* | 3/2007 | Hofmeister et al. | 396/611 |
|---|---|---|---|---|
| 2009/0194026 | A1* | 8/2009 | Burrows et al. | 118/719 |
| 2009/0225160 | A1* | 9/2009 | Shah et al. | 348/94 |
| 2010/0156434 | A1* | 6/2010 | Okino et al. | 324/537 |
| 2010/0261340 | A1* | 10/2010 | Nijhawan et al. | 438/478 |
| 2010/0296903 | A1* | 11/2010 | Shah et al. | 414/589 |
| 2011/0052349 | A1* | 3/2011 | Sone et al. | 414/226.01 |

FOREIGN PATENT DOCUMENTS

| KR | 1020120029798 A | 3/2012 |
|---|---|---|
| KR | 1020120029799 A | 3/2012 |
| KR | 1020120029800 A | 3/2012 |
| KR | 1020120029802 A | 3/2012 |

* cited by examiner

*Primary Examiner* — Yolanda Cumbess
(74) *Attorney, Agent, or Firm* — Kurt Rauschenbach; Rauschenbach Patent Law Group, LLC

(57) ABSTRACT

An automated cassette-to-cassette substrate handling system includes a cassette storage module for storing a plurality of substrates in cassettes before and after processing. A substrate carrier storage module stores a plurality of substrate carriers. A substrate carrier loading/unloading module loads substrates from the cassette storage module onto the plurality of substrate carriers and unloads substrates from the plurality of substrate carriers to the cassette storage module. A transport mechanism transports the plurality of substrates between the cassette storage module and the plurality of substrate carriers and transports the plurality of substrate carriers between the substrate carrier loading/unloading module and a processing chamber. A vision system recognizes recesses in the plurality of substrate carriers corresponding to empty substrate positions in the substrate carrier. A processor receives data from the vision system and instructs the transport mechanism to transport substrates to positions on the substrate carrier in response to the received data.

23 Claims, 6 Drawing Sheets

AUTOMATED CASSETTE-TO-CASSETTE SUBSTRATE HANDLING SYSTEM

FEDERAL RESEARCH STATEMENT

This invention was made with Government support under U.S. Department of Energy SSL Manufacturing Grant DE-EE0003252. The Government has certain rights in this invention.

The section headings used herein are for organizational purposes only and should not to be construed as limiting the subject matter described in the present application in any way.

INTRODUCTION

Material processing systems typically store substrates in cassettes before and after processing. Many of these material processing systems include substrate carriers for supporting and sometimes transporting substrates during processing. The substrate is often a disc of crystalline material that is commonly called a wafer. The terms "substrate" and "wafer" as used herein are equivalent. One such type of material processing system is a vapor phase epitaxy (VPE) system. Vapor phase epitaxy is a type of chemical vapor deposition (CVD) which involves directing one or more gases containing chemical species onto a surface of a substrate so that the reactive species react and form a film on the surface of the substrate. For example, VPE systems can be used to grow compound semiconductor materials on substrates.

Materials are typically grown by injecting at least one precursor gas and, in many processes, at least a first and a second precursor gas into a process chamber containing the crystalline substrate. Compound semiconductors, such as III-V semiconductors, can be formed by growing various layers of semiconductor materials on a substrate using a hydride precursor gas and an organometalic precursor gas. Metalorganic vapor phase epitaxy (MOVPE) is a vapor deposition method that is commonly used to grow compound semiconductors using a surface reaction of metalorganics and hydrides containing the required chemical elements. For example, indium phosphide could be grown in a reactor on a substrate by introducing trimethylindium and phosphine.

Alternative names for MOVPE used in the art include organometallic vapor phase epitaxy (OMVPE), metalorganic chemical vapor deposition (MOCVD), and organometallic chemical vapor deposition (OMCVD). In these processes, the gases are reacted with one another at the growth surface of a substrate, such as a sapphire, Si, GaAs, InP, InAs or GaP substrate, to form a III-V compound of the general formula $In_xGa_YAl_ZN_AAs_BP_CSb_D$, where X+Y+Z equals approximately one, and A+B+C+D equals approximately one, and each of X, Y, Z, A, B, C, and D can be between zero and one. In various processes, the substrate can be a metal, semiconductor, or an insulating substrate. In some instances, bismuth may be used in place of some or all of the other Group III metals.

Compound semiconductors, such as III-V semiconductors, can also be formed by growing various layers of semiconductor materials on a substrate using a hydride or a halide precursor gas process. In one halide vapor phase epitaxy (HVPE) process, Group III nitrides (e.g., GaN, AlN) are formed by reacting hot gaseous metal chlorides (e.g., GaCl or AlCl) with ammonia gas ($NH_3$). The metal chlorides are generated by passing hot HCl gas over the hot Group III metals. One feature of HVPE is that it can have a very high growth rate, up to 100 μm per hour for some state-of-the-art processes. Another feature of HVPE is that it can be used to deposit relatively high quality films because films are grown in a carbon free environment and because the hot HCl gas provides a self-cleaning effect.

In these processes, the substrate is maintained at an elevated temperature within a reaction chamber. The precursor gases are typically mixed with inert carrier gases and are then directed into the reaction chamber. Typically, the gases are at a relatively low temperature when they are introduced into the reaction chamber. As the gases reach the hot substrate, their temperature, and hence their available energy for reaction, increases. Formation of the epitaxial layer occurs by final pyrolysis of the constituent chemicals at the substrate surface. Crystals are formed by a chemical reaction on the surface of the substrate and not by physical deposition processes. Consequently, VPE is a desirable growth technique for thermodynamically metastable alloys. Currently, VPE is commonly used for manufacturing laser diodes, solar cells, and light emitting diodes (LEDs).

SUMMARY OF THE INVENTION

An automated cassette-to-cassette substrate handling system according to the present teaching includes a cassette storage module for storing a plurality of substrates in cassettes before and after processing. A substrate carrier storage module stores a plurality of substrate carriers. A substrate carrier loading/unloading module is used to load substrates from the cassette storage module onto the plurality of substrate carriers and also to unload substrates from the plurality of substrate carriers to the cassette storage module after processing. A transport mechanism transports the plurality of substrates between the cassette storage module and the plurality of substrate carriers and transports the plurality of substrate carriers between substrate carrier loading/unloading module and a processing chamber. The transport mechanism may include a Bernoulli head positioned on a robot end effector that picks and places substrates to and from one of the plurality of substrate carrier. A substrate aligning station aligns substrates so that when they are picked up and transported by the transport mechanism, they are positioned for placement on a predetermined one of the empty substrate positions in a substrate carrier. The substrate handling system can also interface through a feedback system with one or more process tools through one or more equipment front end modules. The feedback system can provide information regarding the number and types of substrates on the substrate carriers as well as status information between a plurality of process tool sets such that if one process tool set has production interruptions, the substrates can be shifted to another process tool set within a particular process tool set or another process tool set within the production fab so that production continues without interruption.

An illumination source may illuminate predetermined substrates in the substrate carrier and/or the cassette. A vision system including a sensor is positioned to recognize recesses in the plurality of substrate carriers corresponding to empty substrate positions in the substrate carrier. A processor having an input that is coupled to a data output of the vision system and an output that is coupled to a control input of the transport mechanism receives data from the vision system and instructs the transport mechanism to transport substrates to positions on the substrate carrier in response to the received data. The processor determines center positions of the empty substrate positions in at least some of the plurality of substrate carrier using the data received from the vision system and then instructs the transport mechanism to transport substrates to predetermined positions on the corresponding substrate carriers in response to the determined center positions.

A method of transporting substrates to a process chamber for processing according to the present teaching includes mapping a cassette with a through-beam sensor system to determine where unprocessed substrates are located in the cassette. Unprocessed substrates located from the mapping are picked with a substrate transfer mechanism and sequentially placed on a substrate aligning station where the substrates are positioned at known locations. The unprocessed substrates are then picked from the substrate aligning station and placed on empty positions in a substrate carrier. A substrate carrier loaded with the plurality of substrates is picked and then placed into a loadlock. The substrate carrier loaded with the plurality of substrates is then transported from the loadlock to a processing chamber where the plurality of substrates on the substrate carrier is processed.

A method of transporting substrates from a process chamber to a cassette according to the present teaching includes transporting a substrate carrier loaded with a plurality of processed substrates from the process chamber to a loadlock. The substrate carrier loaded with the plurality of processed substrates is picked from the loadlock and then transported from the loadlock to a substrate carrier loading/unloading module. The plurality of processed substrates from the substrate carrier is placed onto a substrate aligning station with a Bernoulli head positioned on a robot end effector or with numerous other placement apparatus. The plurality of processed substrates is then placed into a cassette. The substrate carrier can be mapped with a through-beam sensor system to determine where empty spaces for storing substrates are located in the cassette.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale, emphasis instead generally being placed upon illustrating principles of the teaching. The drawings are not intended to limit the scope of the Applicant's teaching in any way.

DESCRIPTION OF VARIOUS EMBODIMENTS

Figure 1:
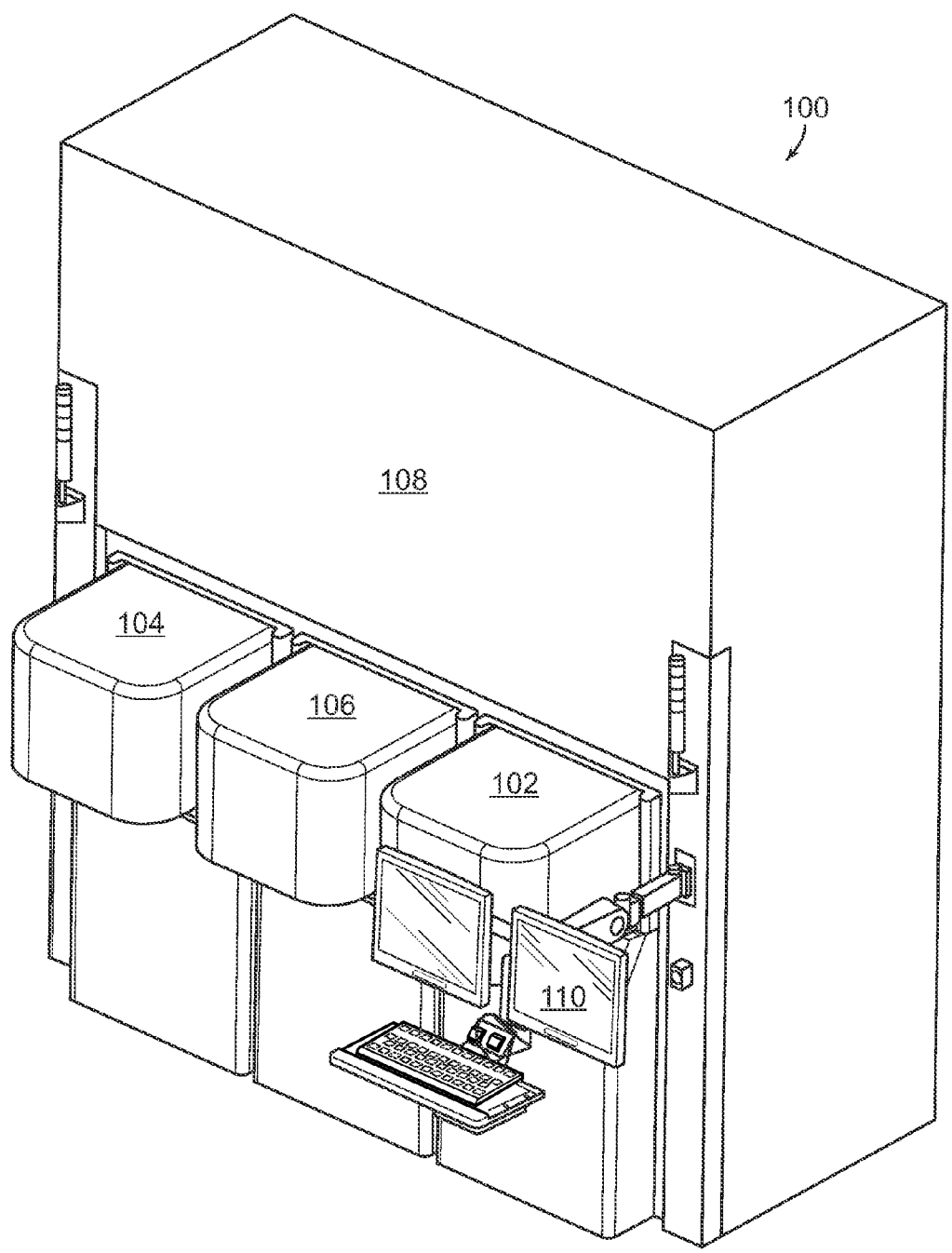
FIG. 1 illustrates an automated cassette-to-cassette substrate handling system according to the present teaching that includes a cassette storage module for storing a plurality of substrates in cassettes before and after processing.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the methods of the present teachings may be performed in any order and/or simultaneously as long as the teaching remains operable. Furthermore, it should be understood that the apparatus and methods of the present teachings can include any number or all of the described embodiments as long as the teaching remains operable.

The present teaching will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

The present teaching relates to methods and apparatus for automated cassette-to-cassette substrate handling where substrates are placed in cassettes at a substrate loading/unloading module with minimal operator "touch time." The substrates are transported to a processing chamber where they are processed. The substrates are then transported back to the substrate loading/unloading module where they are unloaded into the cassettes with no or minimal operator "touch time." Although some aspects of the present teaching are described in connection with substrate handling for VPE systems, one skilled in the art will appreciate that the methods and apparatus of the present invention can be applied to any type of processing system that includes a substrate carrier for supporting any type of substrate. In addition, the methods and apparatus of the present teaching are independent of the substrate or wafer size.

Many material processes require very high throughput to be competitive in the industry. For example, it is highly desirable to achieve a high process throughput of LED and semiconductor laser devices in order for these devices to be cost competitive in the industry.

Furthermore, there is currently a need in the industry to achieve completely automated or nearly automated cassette-to-cassette substrate handling of substrates for various processes, such as VPE substrate processes to manufacture LED and semiconductor laser devices. Also, there is a current need in the industry to significantly increase the substrate throughput, which is measured in substrates processed per hour. The present invention increases the mechanical throughput of substrates in an automated cassette-to-cassette substrate handling system. Mechanical throughput is defined as the throughput number that results from reducing the process time to zero.

FIG. 1 illustrates an automated cassette-to-cassette substrate handling system 100 according to the present teaching that includes a cassette storage module 102 for storing a plurality of substrates in cassettes (not shown) before and after processing. A substrate carrier storage module 104 stores a plurality of substrate carriers (not shown) that are used to support the substrates during processing. A substrate carrier loading/unloading module 106 provides apparatus for loading substrates from the cassette storage module 102 onto the plurality of substrate carriers and for unloading substrates from the plurality of substrate carriers to the cassette storage module 102. A transport mechanism (not shown) inside of the enclosure 108 transports the plurality of substrates between the cassette storage module 102 and the plurality of substrate carriers and also transports the plurality of substrate carriers between the substrate carrier loading/unloading module 106 and a processing chamber (not shown) that is positioned inside of the enclosure 108. An operator interface 110 includes user interfaces, such as keyboards, mice, and monitors to control the operation of the transport mechanism.

Figure 2:
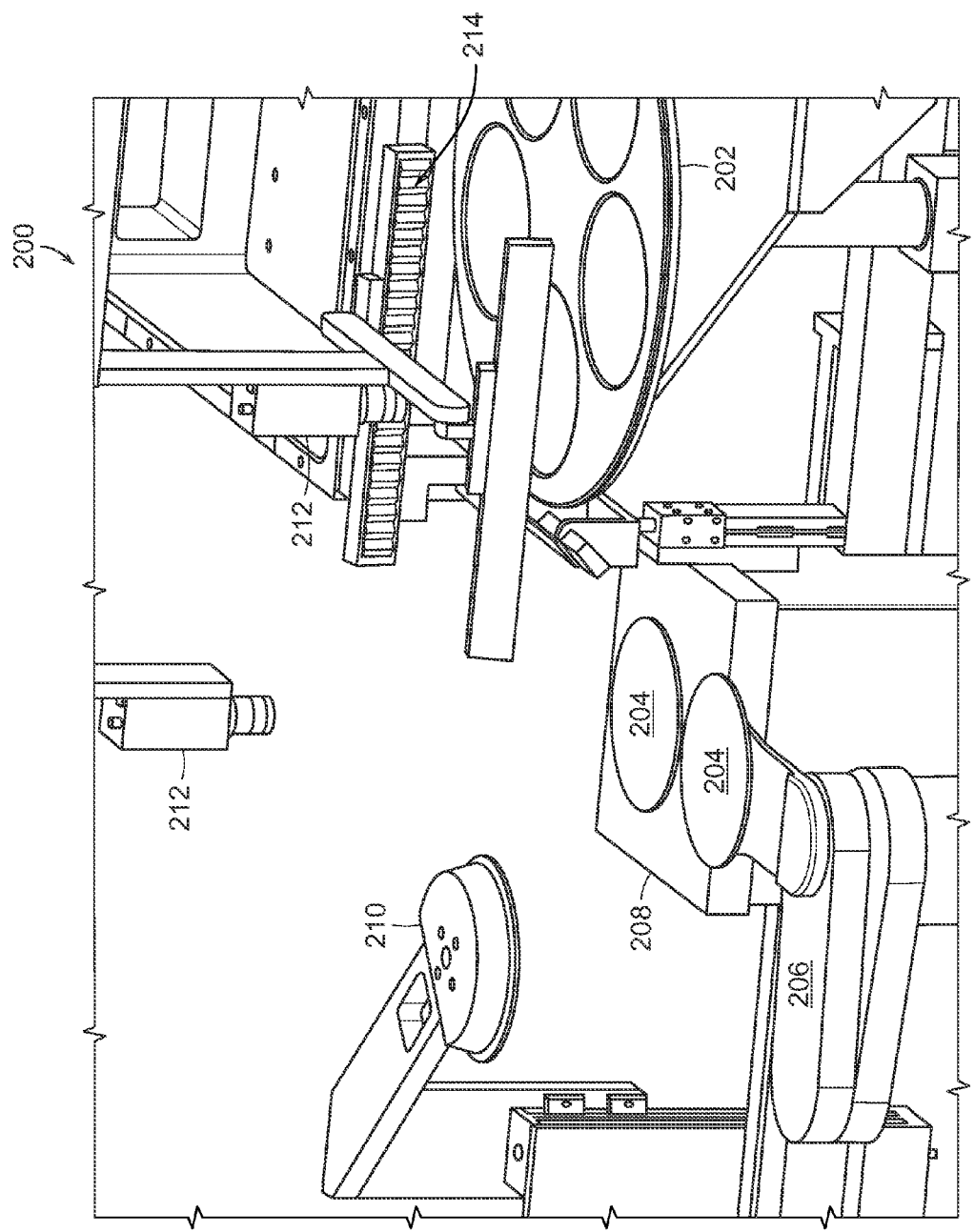
FIG. 2 illustrates a substrate carrier loading/unloading module for loading and unloading substrate carriers according to the present teaching.

FIG. 2 illustrates a substrate carrier loading/unloading module 200 for loading and unloading substrate carriers according to the present teaching. A substrate carrier 202 is shown that supports a plurality of substrates 204. The substrate carrier 202 is transported to and from the substrate carrier loading/unloading module 200 by a transport mechanism 206. In some apparatus according to the present teaching, the transport mechanism 206 comprises a separate substrate transport mechanism and a separate substrate carrier transport mechanism. In other apparatus according to the present teaching, the transport mechanism 206 comprises an integrated substrate transport mechanism and substrate carrier transport mechanism. Also, in some apparatus according to the present teaching, the transport mechanism 206 includes a pick and place robot.

A substrate aligning station 208 is positioned to align substrates 204 so that when they are picked up and transported by the transport mechanism 206 they are positioned for placement on a predetermined one of the empty substrate positions in the substrate carrier 202. In some apparatus according to the present teaching, a Bernoulli head positioned on a robot end effector 210 picks and places the substrates 204 to and from the substrate carrier 202. However, one skilled in the art will appreciate that any type of substrate pick and place apparatus can be used in systems according to the present teaching.

A vision system 212 that includes at least one substrate placement camera is positioned to recognize recesses in the substrate carrier 202 corresponding to empty substrate positions in the substrate carrier 202. An illumination source 214 is used to illuminate the substrate carrier 202. In one embodiment, the illumination source 214 is at least one LED light source. For example, the LED light source can be a pair of linear LED arrays that are positioned adjacent to the edges of the substrate carrier 202 as shown in FIG. 2.

A processor controls the operation of the substrate carrier loading/unloading module 200. The processor includes a data input that is coupled to a data output of the vision system 212 and a data output that is coupled to a control input of the transport mechanism 206. The processor receives data from the vision system 212 and instructs the transport mechanism 206 to transport substrates to positions on the substrate carrier 202 in response to the received data. In some embodiments of the present teaching, a data output of the processor is electrically connected to a control input of the illumination source 214. The processor can control a position of the light beam generated by the illumination source 214 so that it illuminates the desired portion of the substrate carrier 202. In some embodiments according to the present teaching, the processor determines center positions of the empty substrate positions in the substrate carrier 202 using the data received from the vision system 212 and instructs the transport mechanism 206 to transport substrates 204 to predetermined positions on the corresponding substrate carriers 202 in response to the determined center positions. In one embodiment of the present teaching, the processor is programmed to optimize the substrate loading/unloading throughput.

Figure 3:
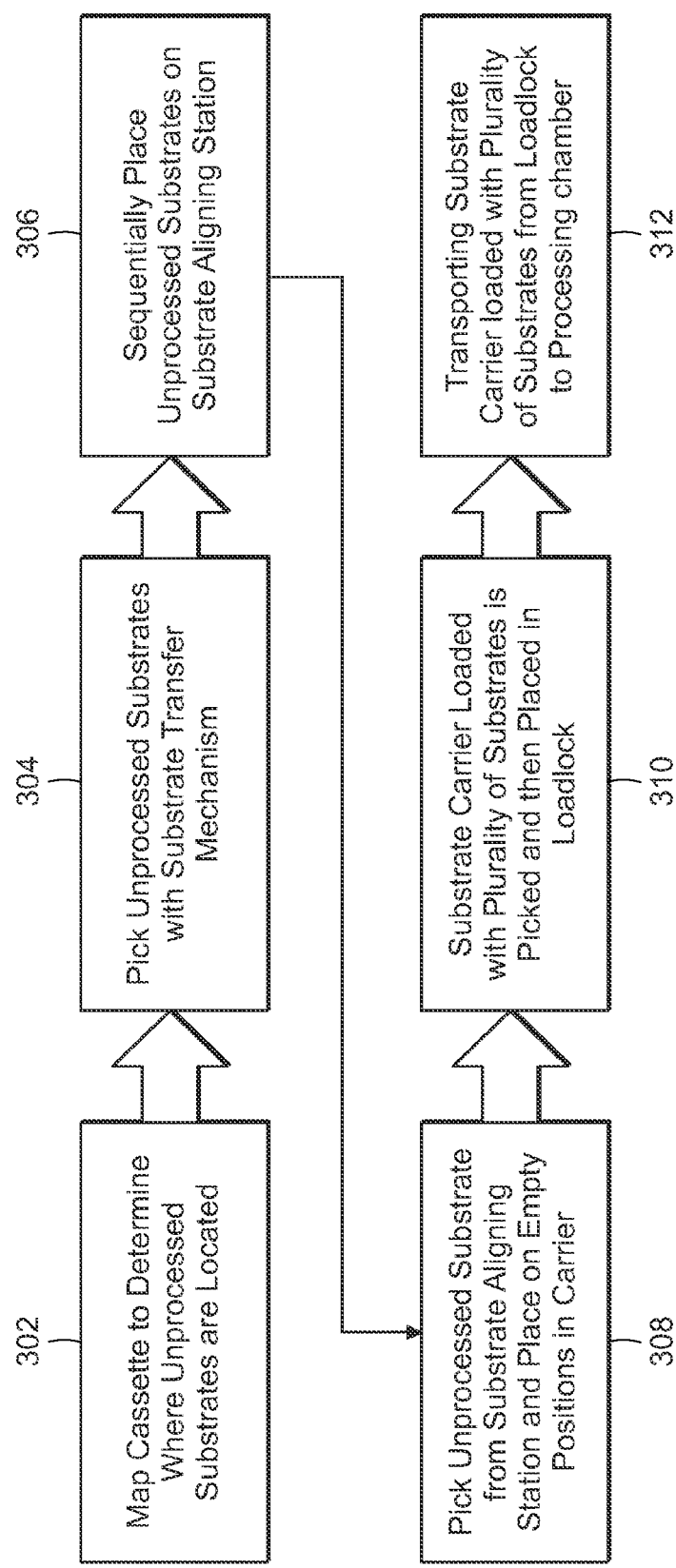
FIG. 3 illustrates a flow chart of a method of transporting substrates to a process chamber for processing according to the present teaching.

FIG. 3 illustrates a flow chart 300 of a method of transporting substrates to a process chamber for processing according to the present teaching. Referring to FIGS. 1, 2 and 3, in a first step 302, a cassette is mapped to determine where unprocessed substrates 204 are located in the cassette. For example, the cassette can be mapped with a through-beam sensor system that detects the presence of unprocessed substrates and then sends data representing the mapping to the processor or to memory. In some methods, the substrate carrier 202 is illuminated while mapping the cassette in the first step 302.

In a second step 304, the unprocessed substrates are then picked with the substrate transfer mechanism 206 from locations determined by the mapping in the first step 302. In the third step 306, the picked unprocessed substrates are then sequentially placed on the substrate aligning station 208 where the substrates are positioned at known locations.

In a fourth step 308, the unprocessed substrates are picked from the substrate aligning station 208 and then placed on empty positions in the substrate carrier 202. In many methods, the picking the plurality of substrates from the substrate aligning station 208 and placing the plurality of substrates on a substrate carrier 202 is performed with a Bernoulli head positioned on a robot end effector 210. In some methods, the picking the unprocessed substrates from the substrate aligning station 208 and placing the unprocessed substrates 204 on empty positions in the substrate carrier 202 is performed in the substrate carrier loading/unloading module 200. Also, in some methods, the substrate carrier 202 is picked out of the substrate carrier storage module 104 before picking the substrates from the substrate aligning station 208 and placing the plurality of substrates 204 on empty positions in the substrate carrier 202. In these methods, the substrate carrier 202 is transported to a substrate carrier load/unload module 106 where the plurality of substrates are loaded.

In a fifth step 310, the substrate carrier 202 loaded with the plurality of substrates is picked and then placed into a loadlock. Finally, in a sixth step 312, the substrate carrier 202 loaded with the plurality of substrates is transported from the loadlock to a processing chamber where the plurality of substrates 204 placed on the substrate carrier 202 is processed.

Figure 4:
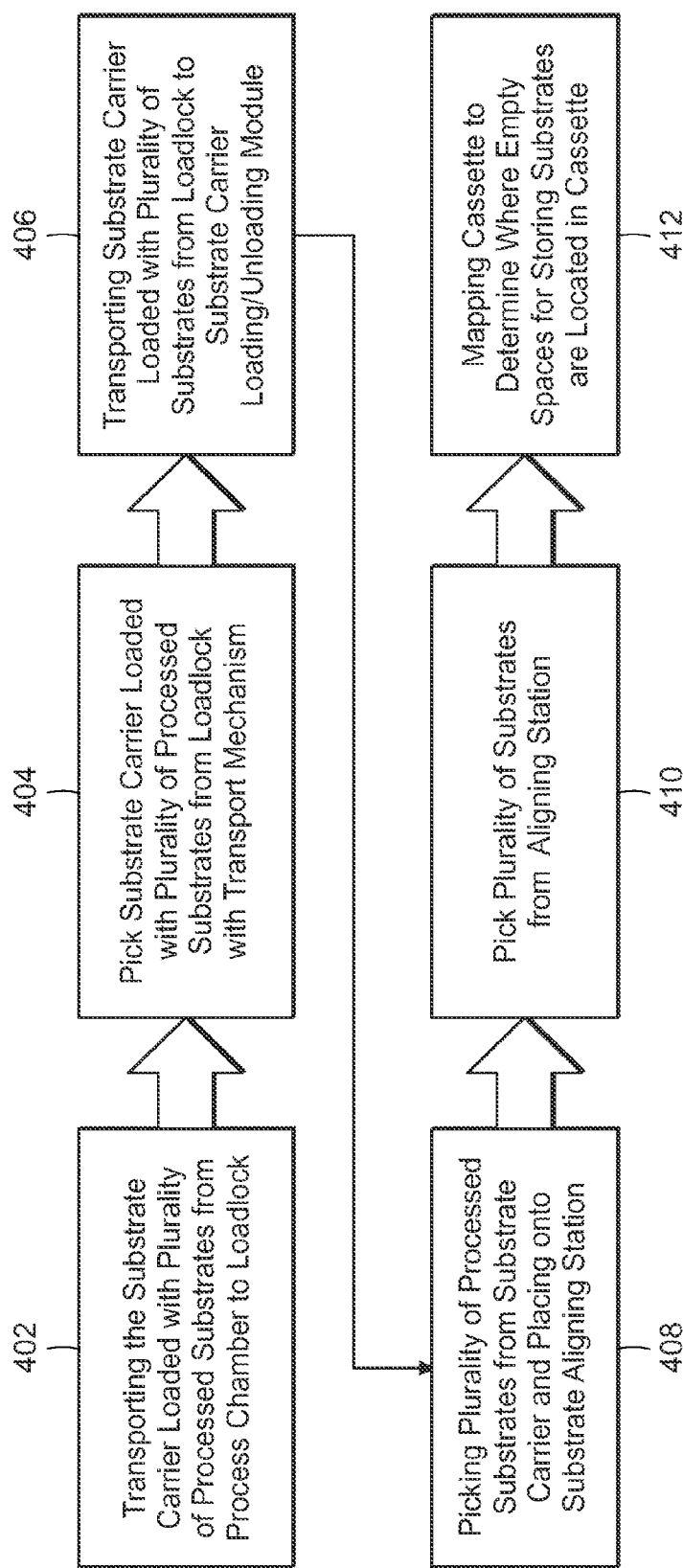
FIG. 4 illustrates a flow chart of a method of transporting substrates from a process chamber to a cassette according to the present teaching.

FIG. 4 illustrates a flow chart 400 of a method of transporting substrates from a process chamber to a cassette according to the present teaching. Referring to FIGS. 1, 2 and 3, in a first step 402, the substrate carrier loaded with a plurality of processed substrates is transported from the process chamber to the loadlock. In a second step 404, the substrate carrier loaded with the plurality of processed substrates is picked from the loadlock with the transport mechanism 206. In a third step 406, the substrate carrier loaded with the plurality of processed substrates is transported from the loadlock to the substrate carrier loading/unloading module 200. In a fourth step 408, the plurality of processed substrates is picked from the substrate carrier 202 and placed onto the substrate aligning station 208. In a fifth step 410, the plurality of processed substrates is picked from the aligning station. In a sixth step 412, the cassette is mapped with a vision system 212 to determine where empty spaces for storing substrates 204 are located in the cassette, which may be the same cassette that stored the plurality of unprocessed substrates or a different cassette. In many methods, the cassette is illuminated while mapping the cassette with the through-beam sensor system. In many methods, the cassette is positioned in the cassette storage module 102. Also, in many embodiments, the plurality of processed substrates is picked and placed using a Bernoulli head positioned on a robot end effector 210.

The automated cassette-to-cassette substrate handling system of the present teaching can be used in many different substrate handling architectures. In some embodiments of the present teaching, the automated cassette-to-cassette substrate handling system is used to feed multiple process tools. For example, the automated cassette-to-cassette substrate handling system can be used to feed a cluster of MOCVD process tools. The automated cassette-to-cassette substrate handling system can be embodied in a central substrate carrier loader that is used to load wafer carriers with unprocessed substrates and to unload wafer carriers with processed substrates.

Figure 5:
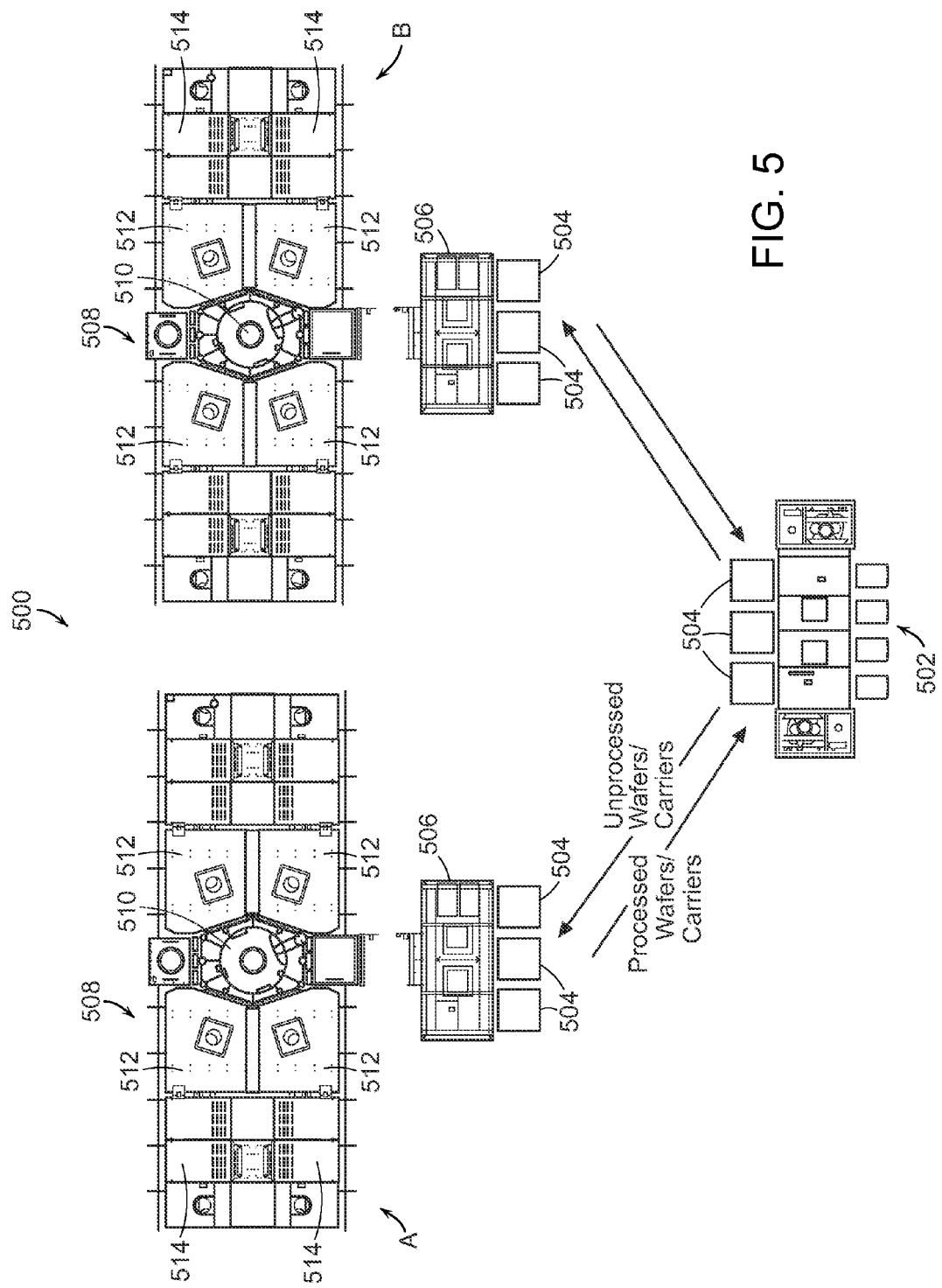
FIG. 5 illustrates a multiple chamber process tool system that includes an automated cassette-to-cassette substrate handling system according to the present teaching for transporting substrate carriers with unprocessed and processed substrates to and from the multiple process tools.

FIG. 5 illustrates a multiple chamber process tool system 500 that includes an automated cassette-to-cassette substrate handling system according to the present teaching for interfacing with and transporting substrate carriers with unprocessed and processed substrates to and from the multiple process tools. The multiple process tools can include multi-chamber process tools. The automated cassette-to-cassette substrate handling system includes a substrate carrier loader 502. In some systems according to the present invention, the substrate carrier loader 502 is centrally located in the multiple process tool system 500. The substrate carrier loader 502 loads unprocessed substrates in the substrate carriers 504 and unloads processed substrates from the substrate carrier 504.

An automated guided vehicle (not shown) transports the substrate carriers 504 to and from one or more of a plurality of equipment front end modules (EFEMs) 506. Each of the plurality of equipment front end modules 506 has an interface that couples to the substrate carriers 504 and a vacuum load lock where substrates transition from atmosphere to high vacuum for processing in the process tool. A robot arm in the equipment front end module 506 is used to transport the substrates from the substrate carriers 504 through the equipment front end module 506 to a respective one of the process tools 508. Various substrate transfer mechanisms can be used with the robot arm to transport the substrates to the process tool 508. In the particular embodiment shown in FIG. 5, the robot arm in the equipment front end module 506 is used to transport the substrates from the substrate carriers 504 through the equipment front end module 506 to a substrate transport chamber 510 in a multi-chamber MOCVD process tool 512 that are supported by separate process gas handling systems 514.

The substrate transport chamber 510 in the process tool 508 includes a robot arm that transports the substrates from the equipment front end module 506 to one of the process chambers 512. In the embodiment shown in FIG. 5, the process tool 508 includes four process chambers 512. In other embodiments according to the present teaching, the process tool 508 can include any number of process chambers 512. In some processes, the substrates are processed in only one of the process chambers 512 and then transported back to the substrate transport chamber 510 and then to the equipment front end module 506. In other processes, the substrates are processed in two or more of the process chambers 512 and then transported back to the substrate transport chamber 510 and then to the equipment front end module 506.

The system shown in FIG. 5 illustrates two multi-chamber MOCVD process tools. One skilled in the art will appreciate that the methods and apparatus of the present invention can be used with any type of process tool. In addition, one skilled in the art will appreciate that the methods and apparatus of the present invention can be used with any number of process tools in any geometry. The system shown in FIG. 5 can provide for a feedback system between the individual process tools through the substrate handling system. For example, as substrate carriers are sent to EFEM 506 in process tool set A and to EFEM 506 in process tool set B from substrate loader 502, the number of substrates in each substrate carrier 504 is being logged so that operators within the fab where process tools A and B (as well as other process tools connected to substrate loader 502 within a particular cluster or geometry) will know how many substrates are being loaded into the various process tools. If, for example, there is a shutdown or equipment failure within process tool set B which prevents substrates from being processed, the feedback system could provide a signal to an operator who could manually stop substrates from being transferred to EFEM 506 in process tool set B. Alternatively, an automated signal could be sent from EFEM 506 in process tool set B to substrate carrier loader 502. The operator or an automated program could then determine how best to process the wafers that were previously allotted to process tool set B in another process tool set so that the fab can continue to run without a drop in production. Once the process tool set B is up and running in an appropriate manner, substrates can then be sent to process tool set B through EFEM 506.

In the multiple process tool system 500, the method of the present teaching are performed in different locations compared with the automated cassette-to-cassette substrate handling system described in connection with FIG. 1 that is designed to work with a single process tool. Referring to the flow chart 300 of the method of transporting substrates to a process chamber for processing shown in FIG. 3 and to the multiple process tool system 500 that is shown in FIG. 5, the first step 302 where a cassette is mapped to determine where unprocessed substrates are located in the cassette is performed in the substrate carrier loader 502. Similarly, the second step 304 where the unprocessed substrates are picked with the substrate transfer mechanism from locations determined by the mapping in the first step 302, the third step 306 where the picked unprocessed substrates are sequentially placed on the substrate aligning station 208 where the substrates are positioned at known locations, and the fourth step 308 where the unprocessed substrates are picked from the substrate aligning station 208 and then placed on empty positions in the substrate carrier 202 are all performed in the substrate carrier loader 502.

However, the fifth step 310 where the substrate carrier 202 is loaded with the plurality of substrates and picked and then placed into a loadlock is performed in the equipment front end module 506. Similarly, the sixth step 312 where the substrate carrier loaded with the plurality of substrates is transported from the loadlock to a processing chamber where the plurality of substrates placed on the substrate carrier 202 is processed is performed in the equipment front end module 506.

Also, referring to the flow chart 400 of a method of transporting substrates from a process chamber to a cassette, the first step 402 where the substrate carrier loaded with a plurality of processed substrates is transported from the process chamber to the loadlock is performed in the substrate transport chamber 510 in the multiple-chamber process tool 500 and in the equipment front end module 506. The second step 404 where the substrate carrier loaded with the plurality of processed substrates is picked from the loadlock with the transport mechanism, and the third step 406 where the substrate carrier loaded with the plurality of processed substrates is transported from the loadlock to the substrate carrier loading/unloading module is performed in the equipment front end module 506.

The fourth step 408 where the plurality of processed substrates is picked from the substrate carrier and placed onto the substrate aligning station, the fifth step 410 where the plurality of processed substrates is picked from the aligning station, and the sixth step 412 where the cassette is mapped with a vision system to determine where empty spaces for storing substrates are located in the cassette are all performed in the substrate carrier loader 506.

Figure 6:
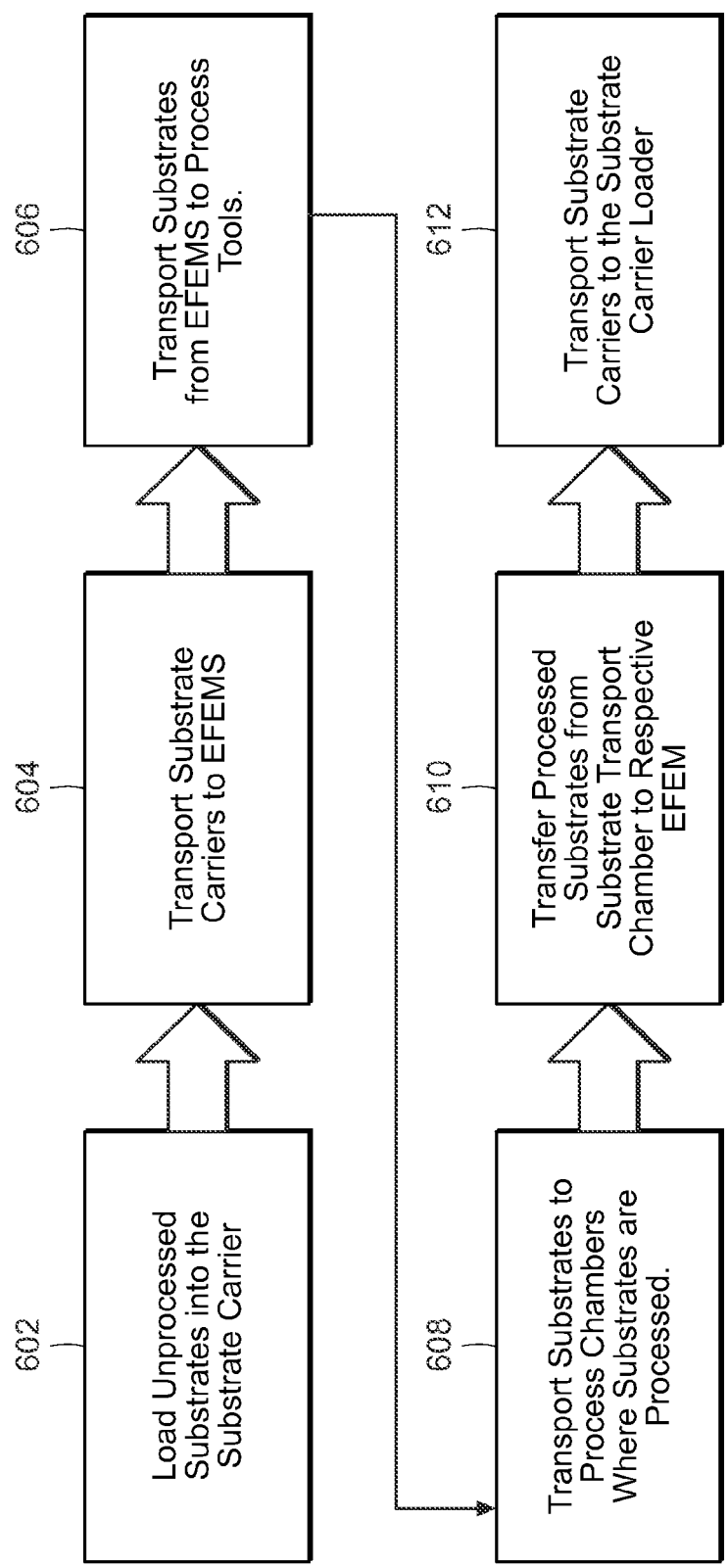
FIG. 6 illustrates a flow chart of a method of cassette-to cassette substrate handling for the multiple chamber process tool system shown in FIG. 5.

FIG. 6 illustrates a flow chart 600 of a method of cassette-to-cassette substrate handling for the multiple chamber process tool system 500 shown in FIG. 5. Referring to FIGS. 5 and 6, in a first step, 602 the substrate carrier loader 502 loads unprocessed substrates into the substrate carriers 504. In a second step 604, an automated guided vehicle transports a plurality of substrate carriers 504 to a plurality of equipment front end modules 506. In a third step 606, robot arms in the equipment front end modules 506 are used to transport the substrates from the substrate carriers 504 through the respective one of the plurality of equipment front end modules 506 to a respective one of the process tools 508. In a fourth step 608, a robot in the substrate transport chamber 510 transfers substrates to one of a plurality of process chambers where the substrates are processed. In some embodiments, the robot in the substrate transport chamber 510 then transfers substrates to a different process chamber where a second process is performed on the substrate. After processing is complete in the multi-chamber process tool, the substrates are ready to be transferred out of the process tool.

In a fifth step 610, the processed substrates are transferred from the substrate transport chamber 510 of the multi-chamber process tool to the respective equipment front end modules 506 where the robot arms in the respective equipment front end modules 506 load the processed substrates into a substrate carriers 504. In a sixth step 612, the automated guided vehicle transports the substrate carriers 504 to the substrate carrier loader 502. In various embodiments, the substrate carriers 504 can be transported by the automated guided vehicle to another one of the plurality of processing tools 508 for additional processing or the processed substrates can be unloaded.

Equivalents

While the applicants' teaching is described in conjunction with various embodiments, it is not intended that the applicants' teaching be limited to such embodiments. On the contrary, the applicants' teaching encompass various alternatives, modifications, and equivalents, as will be appreciated by those of skill in the art, which may be made therein without departing from the spirit and scope of the teaching.

What is claimed is:

1. An automated cassette-to-cassette substrate handling system comprising:
   a) a cassette storage module for storing a plurality of substrates in cassettes before and after processing;
   b) a substrate carrier storage module for storing a plurality of substrate carriers;
   c) a substrate carrier loading/unloading module for loading substrates from the cassette storage module onto the plurality of substrate carriers and for unloading substrates from the plurality of substrate carriers to the cassette storage module;
   d) a transport mechanism that transports the plurality of substrates between the cassette storage module and the plurality of substrate carriers and that transports the plurality of substrate carriers between the substrate carrier loading/unloading module and a processing chamber;
   e) a vision system comprising a sensor positioned to recognize recesses in the plurality of substrate carriers corresponding to empty substrate positions in the substrate carrier; and
   f) a processor having an input that is coupled to a data output of the vision system and an output that is coupled to a control input of the transport mechanism, the processor receiving data from the vision system and instructing the transport mechanism to transport substrates to positions on the substrate carrier in response to the received data.

2. The substrate handling system of claim 1 further comprising an illumination source that illuminates predetermined substrates in at least one of the substrate carrier and the cassette.

3. The substrate handling system of claim 2 wherein an output of the processor is electrically connected to a control input of the illumination source, the processor controlling a position of a light beam generated by the light source.

4. The substrate handling system of claim 1 further comprising a substrate aligning station that aligns substrates to known positions so that when they are picked up and transported by the transport mechanism they are positioned for placement on a predetermined one of the empty substrate positions in a substrate carrier.

5. The substrate handling system of claim 1 wherein the transport mechanism comprises a Bernoulli head positioned on a robot end effector.

6. The substrate handling system of claim 1 wherein the transport mechanism comprises a pick and place robot.

7. The substrate handling system of claim 1 wherein the transport mechanism comprises a separate substrate transport mechanism and a separate substrate carrier transport mechanism.

8. The substrate handling system of claim 1 wherein the transport mechanism comprises an integrated substrate transport mechanism and substrate carrier transport mechanism.

9. The substrate handling system of claim 1 wherein the processor determines center positions of the empty substrate positions in at least some of the plurality of substrate carrier using the data received from the vision system and instructs the transport mechanism to transport substrates to predetermined positions on the corresponding substrate carriers in response to the determined center positions.

10. The substrate handling system of claim 1 which further interfaces with one or more process tools.

11. The substrate handling system of claim 10 wherein the interface with one or more process tools is through one or more equipment front end modules.

12. A method of transporting substrates to a process chamber for processing, the method comprising:
   a. mapping a cassette with a through-beam sensor system to determine where unprocessed substrates are located in the cassette;
   b. picking unprocessed substrates located from the mapping with a substrate transfer mechanism and sequentially placing the unprocessed substrates on a substrate aligning station where the substrates are positioned at known locations;
   c. picking the unprocessed substrates from the substrate aligning station and placing the substrates on empty positions in a substrate carrier; and
   d. picking a substrate carrier loaded with the plurality of substrates and placing the substrate carrier loaded with the plurality of substrates into a loadlock;

e. transporting the substrate carrier loaded with the plurality of substrates from the loadlock to a processing chamber where the plurality of substrates on the substrate carrier is processed and;

f. picking a substrate carrier out of a substrate carrier storage module before picking the substrates from the substrate aligning station, and placing the plurality of substrates on empty positions in the substrate carrier.

13. The method of claim 12 wherein the cassette is positioned in a cassette storage module.

14. The method of claim 12 wherein the picking the unprocessed substrates from the substrate aligning station and placing the unprocessed substrates on empty positions in the substrate carrier is performed in a substrate carrier loading/unloading module.

15. The method of claim 12 further comprising transporting the substrate carrier to a substrate carrier load/unload module where the plurality of substrates are loaded.

16. The method of claim 12 wherein the picking the plurality of substrates from the substrate aligning station and placing the plurality of substrates on a substrate carrier is performed with a Bernoulli head positioned on a robot end effector.

17. The method of claim 12 wherein the picking the plurality of substrates from the substrate aligning station and placing the plurality of substrates on a substrate carrier is performed with a pick and place robot.

18. The method of claim 12 further comprising illuminating the substrate carrier while mapping the cassette.

19. A method of transporting substrates from a process chamber to a cassette, the method comprising:

a) transporting a substrate carrier loaded with a plurality of processed substrates from the process chamber to a loadlock;

b) picking the substrate carrier loaded with the plurality of processed substrates from the loadlock;

c) transporting the substrate carrier loaded with the plurality of processed substrates from the loadlock to a substrate carrier loading/unloading module;

d) picking the plurality of processed substrates from the substrate carrier and placing the plurality of processed substrates onto a substrate aligning station;

e) placing the plurality of processed substrates from the aligning station into a cassette; and f) mapping the substrate carrier with a through-beam sensor system to determine where empty spaces for storing substrates are located in the cassette.

20. The method of claim 19 wherein the plurality of processed substrates are picked from the substrate carrier and placed onto a substrate aligning station with a Bernoulli head positioned on a robot end effector.

21. The method of claim 19 wherein the plurality of processed substrates are picked from the substrate carrier and placed onto a substrate aligning station with a pick and place robot.

22. The method of claim 19 wherein the cassette is positioned in a cassette storage module.

23. The method of claim 19 further comprising illuminating the cassette while mapping the cassette with a through-beam sensor system.

* * * * *